United States Patent
Shiono et al.

(10) Patent No.: US 6,580,196 B1
(45) Date of Patent: Jun. 17, 2003

(54) PIEZOELECTRIC SINGLE CRYSTAL WAFER

(75) Inventors: Yoshiyuki Shiono, Annaka (JP); Yoshinori Kuwabara, Annaka (JP); Toshihiko Ryuo, Annaka (JP)

(73) Assignee: Shin-Etsu Chemical Co., Ltd., Tokyo (DE)

( * ) Notice: Subject to any disclaimer, the term of this patent is extended or adjusted under 35 U.S.C. 154(b) by 14 days.

(21) Appl. No.: 09/637,011

(22) Filed: Aug. 14, 2000

(30) Foreign Application Priority Data

Aug. 17, 1999 (JP) .......................................... 11-230246
Oct. 28, 1999 (JP) .......................................... 11-306404

(51) Int. Cl.$^7$ ............................................ H01L 41/08
(52) U.S. Cl. .................................. 310/313 A; 310/360
(58) Field of Search ......................... 310/313 A, 313 R, 310/360, 361

(56) References Cited

U.S. PATENT DOCUMENTS

| | | | | |
|---|---|---|---|---|
| 5,500,077 A | * | 3/1996 | Nishibayashi et al. ... | 156/628.1 |
| 5,501,909 A | * | 3/1996 | Higaki et al. ............. | 428/408 |
| 5,755,879 A | * | 5/1998 | Shintani et al. ........... | 117/101 |
| 5,814,149 A | * | 9/1998 | Shintani et al. ........... | 117/104 |
| 6,127,768 A | * | 10/2000 | Stoner et al. ............ | 310/313 A |
| 6,210,780 B1 | * | 4/2001 | Fujii et al. ................. | 428/209 |
| 6,320,296 B1 | * | 11/2001 | Fujii et al. ............... | 310/313 A |

OTHER PUBLICATIONS

Takashi Kimura, Isamu Kotaka and Shokichiro Yoshikawa; "Estimation of surface–acoustic–wave attenuation due to platelet defects"; Jul. 1979; pp. 4767–4772.

Takashi Kimura, Isamu Kotaka and Shokichiro Yoshikawa; "Damage Layer's Effects on SAW Properties"; pp. 17–23.

S. Aikawa, Y. Oana, M. Sakai, M. Ono and Y. Fujiwara; "Relationship between Curie Temperature and SAW velocity of 36° rotated Y–X LiTaO$_3$ for SAW filter"; 1994; p. 19.

Nihon Gakujutushinkoukai Danseihyoumenhasoshigijutu, 150$^{th}$ Committee, Acoustic Wave Element Handbook, pp. 296–298, (1991).

Nihon Gakujutushinkoukai Danseihyoumenhasoshigijutu, 150$^{th}$ Committee, Acoustic Wave Element Handbook, pp. 289–302, (1991).

* cited by examiner

Primary Examiner—Mark O. Budd
(74) Attorney, Agent, or Firm—Oliff and Berridges, PLC

(57) ABSTRACT

There is disclosed a piezoelectric single crystal wafer wherein an etching pit density on the front surface of the wafer on which an electrode for transmit-receive of surface acoustic wave or leaky surface acoustic wave is formed is $7.8 \times 10^4 /mm^2$ or less, and a piezoelectric single crystal wafer wherein surface roughness Ra on the peripheral surface other than the front surface and the reverse surface of the wafer is 2.3 μm or less. There can be provided a piezoelectric single crystal wafer wherein a deviation of surface acoustic wave velocity or leaky surface acoustic wave velocity is small, namely the uniformity of the velocity is excellent, and fine contaminations adhered on the surface where electrode is formed and breakage of the wafer can be significantly reduced, and therefore a device such as a filter having excellent property can be produced in high yield.

7 Claims, 1 Drawing Sheet

Direction of X is vertical to the surface of this sheet.

Direction of X is vertical to the surface of this sheet.

PIEZOELECTRIC SINGLE CRYSTAL WAFER

BACKGROUND OF THE INVENTION

1. Field of the Invention

The present invention relates to piezoelectric single crystal wafer, particularly to piezoelectric single crystal wafer used for fabrication of surface acoustic wave or leaky surface acoustic wave device.

2. Description of the Related Art

Surface acoustic wave device or leaky surface acoustic wave device is a circuit element that convert electric signal respectively to surface acoustic wave or leaky surface acoustic wave to conduct signal processing. They have been conventionally used for a filter, a resonator, a delay line or the like.

Such a surface acoustic wave device or leaky surface acoustic wave device is generally produced by forming electrodes for transmit-receive of surface acoustic wave or leaky surface acoustic wave on a piezoelectric single crystal wafer and cutting it in a form of a chip.

The above-mentioned piezoelectric single crystal wafer itself is generally produced as follows. First, piezoelectric single crystal having a piezoelectricity is grown by an adequate method for growing a single crystal. For example, a crystal ingot made of lithium tantalate is grown by Czochralski method (CZ method). Then, the single crystal ingot is subjected to a cylindrical grinding so that a section vertical to an axis thereof may have a round shape. The resultant cylindrical single crystal ingot is sliced to provide a wafer having a constant crystal surface orientation. Then one side or both sides of the wafer produced thereby was subjected to lapping, mirror polishing in sequence. Thereby, the piezoelectric single crystal wafer can be produced.

On the surface subjected to a mirror polishing of the piezoelectric single crystal wafer thus produced, an electrode mainly made of Al is formed in a regular direction (hereunder the surface on which the electrode is formed is occasionally called "an electrode forming surface" or "a front surface") and cut in a shape of a chip. Thereby, the surface acoustic wave or leaky surface acoustic wave device can be fabricated.

Performance of the surface acoustic wave or leaky surface acoustic wave device produced as above depends on various factors such as material to be used, crystal orientation, design of electrodes, conditions for fabrication or the like. The factor for performance of the surface acoustic wave or leaky surface acoustic wave device that is particularly to be noted is a surface work damage layer existing at a depth of tens $\mu$m or less from the surface of the wafer.

The relation between surface acoustic wave and a surface work damage layer, and a method of polishing a single crystal wafer for a surface acoustic wave considering a surface work damage layer have been reported as follows.

Kimura et al. (Kimura et al., Shingaku Gihou, US 75–56, 17–23, 1975) reported that a relation between the surface work damage layer and Q factor of surface acoustic wave was investigated using quartz, and it was found that when a significant surface work damage layer such as micro crack was present to a depth of a half of wavelength, it was confirmed as difference of the above-mentioned Q factor of surface acoustic wave.

Kimura et al. (T. Kimura et al., J. Appl. Phys., 50 (7), 4767–4772, (1979)) reported that a relation between a surface work damage layer and propagation loss was investigated and analyzed using quartz, and reported a relation between a depth and an amount of micro cracks and propagation loss.

As for a method of polishing a lithium tantalate single crystal wafer for surface acoustic wave, there have been reported as a similar method used for processing of a silicon single crystal wafer, a polishing method wherein $SiO_2$ colloidal polishing agent is used after a lapping process (Nihon Gakujutushinkoukai Danseihyoumenhasoshigijutu, 150th committee, acoustic wave element handbook, 296–298 (1991)). It has been reported that it is important in a polishing step to obtain a state of a mirror surface and completely remove a mechanical damage layer generated in a lapping step, and that polishing with a stock removal of 10 $\mu$m or less is sufficient, since abrasive grains having a diameter of 15 $\mu$m or less is generally used for lapping, and thus a mechanical damage layer is generally formed at a depth of 10 $\mu$m or less.

As described above, there have been previously reported a relation between a surface acoustic wave and a surface work damage layer, or a method of polishing a single crystal wafer for surface acoustic wave considering a surface work damage layer. However, there have not been reported a relation between leaky surface acoustic wave and a surface work damage layer, or a method of polishing a single crystal wafer for leaky surface acoustic wave.

There is a significantly increased demand for surface acoustic wave or leaky surface acoustic wave device as a filter for mobile communication that has been diffused explosively in these years. There is also a demand for improvement in quality thereof, especially a demand for improvement in uniformity of surface acoustic wave velocity or leaky surface acoustic wave velocity on the surface of the piezoelectric single crystal wafer used for a device, and the uniformity among wafers.

The filter for mobile communication is required to be improved not only in quality, but also in cost performance with increase of a demand. The yield in production of the filter have much influence on production cost.

The relation between surface acoustic wave velocity or uniformity thereof and composition, cutting method or propagation direction has been reported (Nihon Gakujutushinkoukai Danseihyoumenhasoshigijutu, 150th committee, surface acoustic wave handbook, 289–302, (1991), and Aikawa et al., Denshijouhoutsushingakkai shuukitaikai, 19 (1994)).

However, there comes to be a problem of a deviation of surface acoustic wave velocity or leaky surface acoustic wave velocity on the surface of the piezoelectric single crystal wafer, and among the wafers, which is considered unable to be explained only with composition, a cutting method, or propagation direction.

There are various factors for failure in production of the filter. Many of them are caused by fine contaminations (particles) adhered on the surface of the wafer or due to breakage of the wafer. The recent filter for mobile communication is often used in a range of frequency of 0.1 to 3 GHz, especially 1 to 2.5 GHz. Accordingly, an electrode having a line width of 1 $\mu$m or less has been requested. Therefore, the fine contaminations having a size of several $\mu$m that did not matter previously are getting a big problem. For example, if an electrode is formed on the wafer on which contaminations having a size of several $\mu$m are adhered, the electrode cannot be formed at a part on which the contaminations are adhered, and thus desired propagation properties cannot be achieved. As a result, yield is lowered, and production cost is increased.

The present invention has been accomplished to solve the above-mentioned problems, and the first object of the present invention is to provide a piezoelectric single crystal wafer for surface acoustic wave or leaky surface acoustic wave device wherein a deviation of surface acoustic wave velocity or leaky surface acoustic wave velocity is small, namely the velocity uniformity is excellent. The second object of the present invention is to provide a piezoelectric single crystal wafer wherein fine contaminations adhered on the surface on which an electrode is formed and breakage of the wafer are significantly reduced, and to provide a piezoelectric single crystal wafer that can provide a filter or the like having an excellent property in high production yield.

The inventors noted and studied from the following two reasons a relation between a deviation of surface acoustic wave velocity or leaky surface acoustic wave velocity and a surface work damage layer.

One of the reasons is that although a relation between Q factor or propagation loss of surface acoustic wave and a surface work damage layer has been reported as described above, a relation between a deviation of surface acoustic wave velocity or leaky surface acoustic wave velocity and a surface work damage layer has not been reported.

The other of the reasons is that it is necessary to consider the surface work damage layer other than micro crack in order to meet the recent requirement for quality.

Although the recent requirement for quality is quite different from the previous requirement, a method for processing and an approach therefor have not been changed. Accordingly, the inventors of the present invention have considered that a state of a part near the surface at which energy of surface acoustic wave or leaky surface acoustic wave is concentrated, namely the surface work damage layer is quite important. The word "surface work damage layer" herein means not only micro crack but also mechanical damage or the like. The inventors have found that measurement of etching pit density is effective as a method of quantitative evaluation of the surface work damage layer. As a result, they have found a correlation between an etching pit density and surface acoustic wave velocity or leaky surface acoustic wave velocity.

SUMMARY OF THE INVENTION

In order to achieve the above-mentioned first object, according to one aspect of the present invention, there is provided a piezoelectric single crystal wafer wherein an etching pit density on the front surface of the wafer on which an electrode for transmit-receive of surface acoustic wave or leaky surface acoustic wave is formed is $7.8 \times 10^4/mm^2$ or less.

As described above, if an etching pit density on the front surface of the wafer on which an electrode for transmit-receive of surface acoustic wave or leaky surface acoustic wave is formed is $7.8 \times 10^4/mm^2$ or less, a deviation of surface acoustic wave velocity or leaky surface acoustic wave velocity in production of the device is small, the piezoelectric single crystal wafer for surface acoustic wave or leaky surface acoustic wave device having an excellent propagation property can be provided.

The inventors have also studied and analyzed further fine contaminations adhered on the surface of the wafer, and found that a lot of fine particles consisting of the same material as a single crystal constituting the wafer are adhered on the surface. They have also found that more of the fine particles consisting of the same material as the single crystal are observed at a part nearer the periphery of the wafer. They have studied further occurrence of the fine particles, and found that the piezoelectric single crystal wafer is very easy to break compared with a wafer such as a silicon wafer. Therefore, if there are fine unevenness at peripheral surface of the wafer, the prominence may be broken with only small impact to generate fine particles that will be adhered on the part near the periphery of the wafer. They have also found that breakage of the wafer occurred at the part having fine unevenness on the peripheral surface of the wafer.

According to the above-mentioned findings, the inventors have found that adhesion of the fine particles on the part near the periphery of the wafer can be suppressed and breakage of the wafer can be prevented by providing the piezoelectric single crystal wafer described below. They also have found that a device such as a filter or the like having an excellent propagation property can be produced in high yield by fabricating surface acoustic wave or leaky surface acoustic wave device using such a wafer, and completed the present invention.

In order to achieve the second object of the present invention, according to the second aspect of the present invention, there can be provided a piezoelectric single crystal wafer wherein surface roughness Ra on the peripheral surface other than the front surface of the wafer where an electrode for transmit-receive of surface acoustic wave or leaky surface acoustic wave is formed and the reverse surface thereof is 2.3 $\mu$m or less.

As described above, if the surface roughness Ra on the peripheral surface of the wafer is 2.3 $\mu$m or less, the peripheral surface of the wafer is very smooth, so that the wafer can be prevented from being broken, and there is almost no prominence that may cause generation of fine particles. Accordingly, occurring of crack can be prevented almost completely, during transportation and vacuum in a film-forming step for forming an electrode on the surface of the wafer or in a photolithography step, so that breakage of the wafer can be prevented. Furthermore, there is almost no fine particles generated from the wafer itself, especially on the peripheral surface thereof, that is scraped due to rub with a container, handling or the like. As a result, fine particles adhered on the surface of the wafer are significantly reduced.

On the surface of the piezoelectric single crystal wafer having such a small surface roughness of the peripheral surface, almost no fine contaminations (particles) are adhered, so that there is no part where an electrode is not formed due to presence of the fine contaminations when the electrode is formed on the surface. As a result, a device such as a filter having excellent propagation property can be produced in high yield.

According to the present invention, it is preferable that the above-mentioned piezoelectric single crystal wafer is made of lithium tantalate, lithium niobate, lithium tetraborate, langasite, or quartz. Especially, the piezoelectric single crystal wafer made of lithium tantalate single crystal has well balanced propagation property of surface acoustic wave or leaky surface acoustic wave.

More preferably, the above-mentioned piezoelectric single crystal wafer is a lithium tantalate single crystal wafer wherein the surface of the wafer on which an electrode is formed is parallel to X axis, and a perpendicular line to the surface of the wafer and Y axis make an angle in the range of 33 to 46° (hereinafter referred to as 33–46° Y cut) wherein X axis is a-axis of the single crystal, and Z axis is c-axis thereof, and Y axis is a vertical axis to the X axis and Z axis.

Thus, if the piezoelectric single crystal wafer is the above-mentioned lithium tantalate single crystal, the piezoelectric single crystal wafer shows a further excellent leaky surface acoustic wave propagation property when the electrode is formed on the surface of the wafer on which fine particles are not adhered.

As described above, the piezoelectric single crystal wafer for surface acoustic wave or leaky surface acoustic wave device according to the first aspect of the present invention is characterized in that an etching pit density on the surface of the wafer where an electrode for transmit-receive of surface acoustic wave or leaky surface acoustic wave is formed is $7.8 \times 10^4/mm^2$ or less, and the surface acoustic wave or leaky surface acoustic wave device fabricated using the wafer has a very small deviation of the surface acoustic wave velocity or leaky surface acoustic wave velocity and an excellent propagation property.

The piezoelectric single crystal wafer of the second aspect of the present invention is characterized in that the surface roughness Ra on the peripheral surface is 2.3 µm or less, namely very smooth. Accordingly, almost no breakage of the wafer occurs during transportation and vacuum in a film forming process for forming electrodes on the surface of the wafer or in a photolithography process or the like. There are almost no fine particles generated from the peripheral surface of the wafer ground due to rub with a container, handling or the like. As a result, fine particles adhered on the surface of the wafer is significantly reduced.

As described above, there is almost no fine contamination adhered on the surface of the piezoelectric single crystal wafer having low surface roughness on the peripheral surface. Accordingly, if an electrode is formed on the surface, there is no part where the electrode is not formed due to fine contaminations, so that the device such as a filter having excellent properties can be produced in high yield.

DESCRIPTION OF THE INVENTION AND A PREFERRED EMBODIMENT

Figure 1:
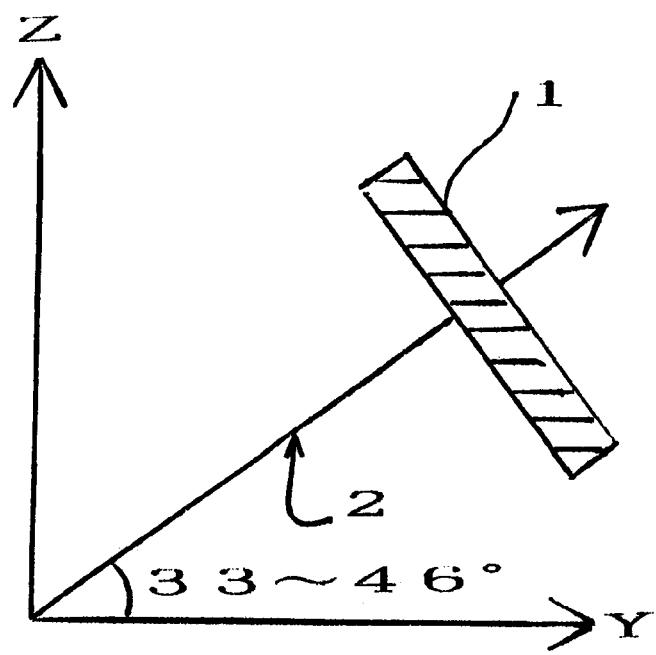
FIG. 1 shows an orientation of the surface of the 33–46° Y cut lithium tantalate single crystal wafer.

The present invention will be further described below in detail, referring a figure, but is not limited thereto.

As described, the inventors have noted and studied a relation between a deviation of surface acoustic wave velocity or leaky surface acoustic wave velocity and a surface work damage layer in surface acoustic wave or leaky surface acoustic wave device. As a result, they found a correlation between an etching pit density on the electrode forming surface of the wafer and a deviation of surface acoustic wave or leaky surface acoustic wave velocity.

Namely, the inventors have found that smaller etching pit density on the electrode forming surface of the piezoelectric single crystal wafer for surface acoustic wave or leaky surface acoustic wave device results in more excellent uniformity of surface acoustic wave velocity or leaky surface acoustic wave velocity, namely smaller deviation of these velocities, when an electrode is formed on the surface to make surface acoustic wave or leaky surface acoustic wave device.

Accordingly, if an etching pit density on the electrode forming surface of the wafer is kept small, a deviation of the velocity of surface acoustic wave or leaky surface acoustic wave in fabrication of a device will be small, so that surface acoustic wave or leaky surface acoustic wave device having excellent propagation property can be provided.

Furthermore, if the piezoelectric single crystal wafer having a small etching pit density is produced, a deviation of surface acoustic wave or leaky surface acoustic wave velocity in fabrication of the device never exceeds a standard value, and a velocity of failure is significantly decreased, which lead to improvement in yield.

According to the first aspect of the present invention, since an etching pit density on the surface of the wafer where an electrode for transmit-receive of surface acoustic wave or leaky surface acoustic wave is formed is $7.8 \times 10^4/mm^2$ or less, the piezoelectric single crystal wafer for surface acoustic wave or leaky surface acoustic wave device has a quite excellent uniformity of the velocity of surface acoustic wave or leaky surface acoustic wave in fabrication of the device, very small deviation of the velocity and an excellent propagation property.

As described above, the piezoelectric single crystal wafer of the second aspect of the present invention is characterized in that surface roughness Ra on the peripheral surface other than both the front surface of the wafer where an electrode for transmit-receive of surface acoustic wave or leaky surface acoustic wave is formed and the reverse surface is 2.3 µm or less. In the present invention, the shape of the "peripheral surface" is not limited, and the "peripheral surface" means the surface other than the front surface of the wafer where the electrode is formed and the reverse surface thereof. Generally, it is also called chamfered surface or peripheral edge surface. However, it does not matter which word is used.

If surface roughness Ra on the peripheral surface is 2.3 µm or less as described above, almost no unevenness is formed on the peripheral surface of the wafer. Accordingly, generation of fine particles and breakage of the wafer can be prevented, during transportation or vacuum in a film-forming step for forming electrode on the surface of the wafer or in a photolithography step. Furthermore, there is generated almost no fine particles originated from the wafer itself due to rub with a container, handling or the like. Accordingly, almost no fine particles are adhered on the surface of the wafer, and there is almost no failure part where electrode is not formed, in fabrication of device using the wafer. As a result, a device such as a filter having excellent propagation property can be produced in high yield.

All material having a good piezoelectricity as a piezoelectric single crystal and providing a wafer having excellent surface acoustic wave or leaky surface acoustic wave property can be applicable to the piezoelectric single crystal wafer of the present invention. Specifically, lithium tantalate, lithium niobate, lithium tetraborate, langasite, or quartz can be exemplified. Lithium tantalate is especially preferable.

In the piezoelectric single crystal wafer of the present invention, the front surface of the wafer where surface acoustic wave or leaky surface acoustic wave is propagated (electrode forming surface) is preferably the surface of the wafer that can suppress propagation loss of surface acoustic wave or leaky surface acoustic wave, and shows optimal surface acoustic wave or leaky surface acoustic wave property suitable for the purpose of use or the like of the wafer.

Particularly, a filter where 33–46° Y cut lithium tantalate is used is often used, with recent diffusion of mobile communication. Since the filter requires especially small deviation of the velocity, 33–46° Y cut lithium tantalate is especially preferable. X axis is a-axis of the lithium tantalate single crystal, and Z axis is c-axis thereof, and Y axis is a vertical axis to the X axis and Z axis.

FIG. 1 is a figure explaining a surface orientation of the wafer having such a preferable wafer surface. In FIG. 1, 1 is a wafer surface, 2 shows a direction of a perpendicular line to the wafer surface 1 (namely, 33–46° rotated Y direction). As shown in FIG. 1, in 33–46° Y cut lithium tantalate single crystal wafer, the wafer surface 1 is parallel to X axis, and a direction of the perpendicular line 2 to the wafer surface 1 and Y axis make an angle of 33–46°.

The method of growing a piezoelectric single crystal can be a FZ method, a boat method, or the like, but preferably a crystal pulling method (CZ method). Namely, a raw material for a piezoelectric single crystal (for example, lithium tantalate crude crystal) is molten, a seed crystal is brought into contact with the melt, and the seed crystal is pulled with being rotated to grow a piezoelectric single crystal.

When the single crystal is pulled upwardly, it is preferable to pull the crystal in a direction wherein a growing axis of the single crystal is vertical to the surface of the crystal enabling suppression of propagation loss of surface acoustic wave or leaky surface acoustic wave and having optimal surface acoustic wave or leaky surface acoustic wave property for the purpose of use or the like of wafer. If the crystal is pulled in such a direction, the surface of the wafer can be crystal surface enabling suppression of propagation loss of leaky surface acoustic wave and having surface acoustic wave or leaky surface acoustic wave property that is optimal for the purpose of use or the like of the wafer, in the case that the single crystal is sliced vertically to the growing axis of the single crystal into wafers as described below. Of course, the crystal can be grown in any direction of the crystal axis, and can be cut to provide an optimal crystal surface.

Specifically, when the piezoelectric single crystal is lithium tantalate single crystal, the seed crystal is preferably pulled so that a direction inclined at 33–46° to a direction of Z axis from Y axis (namely, direction of a perpendicular line 2 in FIG. 1) may be a growing axis (the Y axis and the Z axis have the same meanings as above).

In order to pull the single crystal in such a direction, a seed crystal wherein a direction of a crystal axis thereof is inclined at 33–46° to a direction of Z axis from Y axis (namely, direction of a perpendicular line 2 in FIG. 1) is used as a seed crystal, and it is pulled vertically.

Namely, a seed crystal is processed so that the crystal surface parallel to the X axis wherein a perpendicular line of the crystal surface and the Y axis make an angle of 33 to 46° may be horizontal, is attached to a chuck or the like so that the crystal surface is horizontal, and is pulled vertically with being rotated to grow a single crystal.

Then, the piezoelectric single crystal grown as described above is subjected to cylindrical grinding (cylindrical machining) and the like if desired, and sliced to provide a wafer. In that case, the resultant single crystal is preferably sliced vertically to its growing axis. If it is sliced as described above, machining loss on slicing can be minimized, and yield of the wafer can be improved. Slicing can be conducted with, for example, a multi wire saw, an inner diameter slicer or the like.

The wafer obtained as described above is subjected to chamfering if desired, and to lapping, and then the electrode forming surface is subjected to mirror polishing. In order to make the etching pit density small, polishing conditions such as polishing agent, stock removal or the like can be controlled in mirror polishing. The piezoelectric single crystal wafer of the present invention obtained after mirror polishing has an etching pit on the front surface of the wafer of $7.8 \times 10^4$ pits/mm$^2$ or less, and thus it can be the piezoelectric single crystal wafer for surface acoustic wave or leaky surface acoustic wave device wherein the velocity uniformity on fabrication of device is quite excellent and a deviation of the velocity is very small.

In order to provide a desired surface roughness of the peripheral surface of the piezoelectric single crystal wafer of the present invention, conditions in the above-mentioned chamfering process, for example, grain size of wheel, size of abrasive grains in a polishing agent, or a period of finish polishing with buff can be controlled.

In order to fabricate, for example, leaky surface acoustic wave device with the piezoelectric single crystal wafer having a desired etching pit density, or the piezoelectric single crystal wafer having a desired surface roughness of the peripheral surface, obtained by the above method, a film mainly consisting of Al is formed on the electrode forming surface of the piezoelectric single crystal wafer subjected to mirror polishing, according to a conventional method. Then, the electrode in a desired shape, for example, a comb shape is formed by a micro processing technique using photo lithography or the like, and the wafer is cut into chips to provide a leaky surface acoustic wave device.

In the above embodiment, the piezoelectric single crystal wafer according to the one aspect of the present invention that has a desired etching pit density and the piezoelectric single crystal wafer according to the second aspect of the present invention that has a desired surface roughness of the peripheral surface were explained separately. However, of course, the piezoelectric single crystal wafer that has both of the above features is the most preferable. The wafer having both of the features can be obtained by controlling the above-mentioned conditions such as a grain size of wheel or the like in a chamfering step and the above-mentioned conditions such as stock removal or the like in the mirror polishing step. When the piezoelectric single crystal wafer obtained as above, namely the piezoelectric single crystal wafer wherein an etching pit density on the surface of the wafer is $7.8 \times 10^4$ pits/mm$^2$ or less, and surface roughness Ra of the peripheral surface other than the front surface and the reverse surface of the wafer is 2.3 $\mu$m or less is used, a deviation of surface acoustic wave or leaky surface acoustic wave velocity on fabrication of the device gets small, and therefore, the device such as a filter or the like having excellent propagation property can be fabricated in high yield.

EXAMPLE

The following examples and comparative examples are being submitted to explain the present invention more specifically. These examples are not intended to limit the scope of the present invention.

Example 1, Comparative Example 1

Relation Between Etching Pit Density and a Deviation of a Leaky Surface Acoustic Wave Velocity

[Production of Piezoelectric Single Crystal Wafer]

Lithium tantalate single crystal as a piezoelectric crystal was grown according to CZ method. Namely, lithium tantalate crude crystal as a raw material was molten in a crucible, a lithium tantalate seed crystal was brought into contact with the melt, and then it was pulled with growing the single crystal to produce a lithium tantalate single crystal ingot.

In that case, the seed crystal wherein a direction of the crystal axis is a direction rotated 36° to Z axis direction from Y axis around X axis (namely 36° (rotated) Y direction) was used as a seed crystal, and pulled in a vertical direction. As described above, the single crystal was pulled with a growing axis of 36° rotated Y direction to produce lithium tantalate single crystal ingot having a diameter of 80 mm and a length of 100 mm.

The single crystal ingot was subjected to single domain treatment (operation of same electrical polarization in the crystal), machined in a cylindrical shape having a diameter of 76.2 mm, and sliced with a multi wire saw into wafers (36° Y cut lithium tantalate wafer), so that 36° Y direction may be vertical to the front surface of the wafer. Then, both surfaces of the wafer were subjected to lapping with SiC abrasive grains having an average particle size of 12 $\mu$m, and the surface of the wafer where an electrode for transmit-receive of leaky surface acoustic wave is formed (electrode forming surface) is subjected to mirror-polishing with colloidal polishing agent (produced by Fujimi Incorporated, COMPOL-50) under the condition different from each other to obtain wafers each having different etching pit. The resultant lithium tantalate single crystal wafer had a diameter of 76.2 mm and a thickness of 0.4 mm.

[Measurement of Etching Pit Density]

The lithium tantalate single crystal wafer produced above was immersed in 50% by weight solution of hydrofluoric acid for fifty hours to expose etching pits.

The front surface of the wafer taken from the solution was observed with a microscope, and the number of etching pits is counted. Therefrom, etching pit density was calculated.

In this example, an area of 0.1 mm×0.1 mm was observed with a reflection metallurgical microscope, distinct vision, with a magnifying power of 100, and an etching pit density was measured.

Counting was conducted at one position at a center and four positions at 10 mm from the periphery to the center, namely at totally 5 positions per wafer. Five wafers subjected to mirror polishing under the same condition were observed. Namely, counting was conducted at totally 25 positions. The average of the measured 25 data was defined as the etching pit density for the polishing condition.

[Measurement of Leaky Surface Acoustic Wave Velocity]

Aluminum film was formed on the surface of the wafer to provide the electrode in a comb shape by photo lithography. Thereby 100 of one port resonators were fabricated from one wafer.

The relation between surface acoustic wave velocity or leaky surface acoustic wave velocity and frequency was as follows:

$$v = f\lambda$$

wherein v represents leaky surface acoustic wave velocity (m/s), f represents frequency (MHz), $\lambda$ represents wave length ($\mu$m). In the measurement, electrode period was $\lambda/4=1$ $\mu$m, frequency was measured by network analyzer, and thereby leaky surface acoustic wave velocity was defined.

Difference between maximum value and minimum value of leaky surface acoustic wave velocities on five wafers subjected to mirror polishing under the same condition, namely in 500 data obtained by the measurement, was defined as a deviation of leaky surface acoustic wave under the polishing condition. When the deviation of the leaky surface acoustic wave velocity was 2.0 m/s or less, the wafer came up to the standard.

The results of measurement of etching pit density of the piezoelectric single crystal wafer and the deviation of leaky surface acoustic wave velocity of the resonators fabricated by forming electrode on the wafer were shown in Table 1.

TABLE 1

| Etching pit density ($\times 10^4$ pits/mm$^2$) | Deviation of leaky surface acoustic wave (m/s) |
| --- | --- |
| 20 | 4.8 |
| 16 | 3.7 |
| 11 | 2.5 |
| 7.8 | 2.0 |
| 5.4 | 1.5 |

As shown in Table 1, the relation between etching pit density and leaky surface acoustic wave velocity were well correlated. Namely, when an etching pit density gets smaller, a deviation of leaky surface acoustic wave velocity gets smaller. Reproducibility was also good.

Although the 36° Y cut lithium tantalate single crystal wafers for leaky surface acoustic wave were used in the above examples, an etching pit density and a deviation of the surface acoustic wave velocity of the X cut lithium tantalate single crystal wafer for surface acoustic wave also had the similar relation thereto.

The same results were obtained as for single crystal wafers made of any of lithium niobate, quartz, lithium tetraborate, and langasite.

Example 2, Comparative Example 2

Relation Between Surface Roughness and Number of Fine Contaminations

[Production of Piezoelectric Single Crystal Wafer]

A lithium tantalate single crystal ingot having a diameter of 80 mm and a length of 100 mm was grown by Czochralski method in a pulling direction rotated 36° to Z axis direction from Y axis around X axis (namely 36° Y direction). The single crystal ingot was machined to be in a cylindrical shape having a diameter of 76.2 mm, and sliced with a multi wire saw into wafers so that 36° Y direction may be vertical to the front surface of the wafer (36° Y cut lithium tantalate wafer). Then, the peripheral surface other than the front of the wafer and the reverse surface thereof was subjected to grinding using a external shape grinder with five kinds of wheels shown in Table 2 (Methods A to E). Then, the both side were subjected to lapping and the front of the wafer surface of the wafer was subjected to mirror polishing.

The lithium tantalate single crystal wafer produced as described above had a diameter of 76.2 mm and a thickness of 0.4 mm.

[Measurement of Surface Roughness of the Peripheral Surface]

Surface roughness Ra of the peripheral surface other than the front surface and the reverse surface of the wafer was measured with a surface shape measuring microscope, VF-7500 manufactured by KEYENCE Corporation, at pitch of 0.1 $\mu$m and Z-dist of 50 $\mu$m. Measurement was conducted at four arbitrary positions on the peripheral surface of the wafer and an average thereof was shown as Ra in Table 2.

[Evaluation of Breakage of Wafer and Measurement of Fine Contaminations]

Electrode was formed on each of the obtained wafers in a electrode forming step. An occurring rate of the breakage of the wafer was investigated for 150 wafers. The results were shown in Table 2. Four arbitrary positions at 6 mm from the periphery of the wafer were observed with a metallurgical microscope to measure the number of fine contaminations having a size of 0.5 to 10 $\mu$m. An average thereof was shown as the number of fine contaminations in Table 2.

TABLE 2

| Method | Grain size of wheel | Surface roughness on the peripheral surface Ra ($\mu$m) | Occurring rate of breakage of wafer (%) | Number of fine contaminations (number) |
|---|---|---|---|---|
| A | 200 | 4.8 | 17 | 377 |
| B | 400 | 3.7 | 15 | 182 |
| C | 800 | 2.3 | 1 | 10 |
| D | 1200 | 1.4 | 0 | 14 |
| E | 2000 | 1.1 | 0 | 9 |

As shown in Table 2, in the wafer having the surface roughness on the peripheral surface Ra of 2.3 $\mu$m or less, the occurring rate of breakage of wafer was extremely low and the number of fine contaminations was also extremely small, compared with the wafer having Ra of 3.7$\mu$ or more.

Although the 36° Y cut lithium tantalate single crystal wafer was used in the above Examples and Comparative Examples, the similar results could be obtained, when the piezoelectric single crystal wafer made of lithium tantalate having other orientation, lithium niobate, quartz, lithium tetraborate, langasite, or quartz was used.

The present invention is not limited to the above-described embodiment. The above-described embodiment is a mere example, and those having the substantially same structure as that described in the appended claims and providing the similar action and effects are included in the scope of the present invention.

What is claimed is:

1. A piezoelectric single crystal wafer, wherein surface roughness Ra on the peripheral surface other than both the front surface and the reverse surface of the wafer is 2.3 $\mu$m or less, the front surface being one surface to form an electrode for transmit-receive of surface acoustic wave or leaky surface acoustic wave thereon and the reverse surface being the other surface.

2. The piezoelectric single crystal wafer according to claim 1 made of lithium tantalate, lithium niobate, lithium tetraborate, langasite, or quartz.

3. The piezoelectric single crystal wafer according to claim 1 wherein the wafer is a lithium tantalate single crystal and the surface of the wafer on which an electrode is formed is parallel to X axis, and a perpendicular line to the surface of the wafer and Y axis make an angle in the range of 33 to 46° wherein X axis is a-axis of the single crystal, and Z axis is c-axis thereof, and Y axis is a vertical axis to the X axis and Z axis.

4. A piezoelectric single crystal wafer, wherein an etching pit density on the front surface of the wafer on which an electrode for transmit-receive of surface acoustic wave or leaky surface acoustic wave is formed is 7.8×10$^4$/mm$^2$ or less and surface roughness Ra on the peripheral surface other than both the front surface and the reverse surface of the wafer is 2.3 $\mu$m or less, the front surface being one surface to form an electrode for transmit-receive of surface acoustic wave or leaky surface acoustic wave thereon and the reverse surface being the other surface.

5. The piezoelectric single crystal wafer according to claim 4 made of lithium tantalate, lithium niobate, lithium tetraborate, langasite, or quartz.

6. The piezoelectric single crystal wafer according to claim 4 wherein the wafer is a lithium tantalate single crystal and the surface of the wafer on which an electrode is formed is parallel to X axis, and a perpendicular line to the surface of the wafer and Y axis make an angle in the range of 33 to 46° wherein X axis is a-axis of the single crystal, and Z axis is c-axis thereof, and Y axis is a vertical axis to the X axis and Z axis.

7. A piezoelectric single crystal wafer, wherein an etching pit density on the front surface of the wafer on which an electrode for transmit-receive of surface acoustic wave or leaky surface acoustic wave is formed is 7.8×10$^4$/mm$^2$ or less and the wafer is a lithium tantalate single crystal and the surface of the wafer on which an electrode is formed is parallel to X axis, and a perpendicular line to the surface of the wafer and Y axis make an angle in the range of 33 to 46° wherein X axis is a-axis of the single crystal, and Z axis is c-axis thereof, and Y axis is a vertical axis to the X axis and Z axis.

\* \* \* \* \*